(12) United States Patent
Pfeiffer et al.

(10) Patent No.: US 9,024,181 B2
(45) Date of Patent: May 5, 2015

(54) PHOTOACTIVE COMPONENT COMPRISING ORGANIC LAYERS

(75) Inventors: Martin Pfeiffer, Dresden (DE); Christian Uhrich, Dresden (DE); Bert Maennig, Dresden (DE)

(73) Assignee: Heliatek GmbH, Dresden (DE)

( * ) Notice: Subject to any disclaimer, the term of this patent is extended or adjusted under 35 U.S.C. 154(b) by 73 days.

(21) Appl. No.: 13/639,452

(22) PCT Filed: May 4, 2011

(86) PCT No.: PCT/EP2011/002221
§ 371 (c)(1),
(2), (4) Date: Dec. 5, 2012

(87) PCT Pub. No.: WO2011/138021
PCT Pub. Date: Nov. 10, 2011

(65) Prior Publication Data
US 2013/0104968 A1   May 2, 2013

(30) Foreign Application Priority Data
May 4, 2010  (EP) .................... 10161920

(51) Int. Cl.
*H01L 31/00* (2006.01)
*H01L 31/0352* (2006.01)
*H01L 27/30* (2006.01)
*H01L 51/42* (2006.01)
*H01L 51/44* (2006.01)
*B82Y 30/00* (2011.01)

(52) U.S. Cl.
CPC ...... *H01L 31/035272* (2013.01); *H01L 27/302* (2013.01); *H01L 51/4246* (2013.01); *H01L 51/4293* (2013.01); *H01L 51/447* (2013.01); *B82Y 30/00* (2013.01); *Y02E 10/549* (2013.01)

(58) Field of Classification Search
USPC ......................................... 136/263
See application file for complete search history.

(56) References Cited

U.S. PATENT DOCUMENTS 5,093,698 A    3/1992  Egusa
6,559,375 B1   5/2003  Meissner et al.
7,675,057 B2   3/2010  Drechsel et al.
(Continued)

FOREIGN PATENT DOCUMENTS

DE    10 2004 014 046 A1    9/2004
DE    DE 103 38 406 A1       3/2005
(Continued)

OTHER PUBLICATIONS

Frackowiak et al., Journal of Photochemistry and Photobiology A: Chemistry, 141 (2001) 101-108.*
(Continued)

*Primary Examiner* — Eli Mekhlin
(74) *Attorney, Agent, or Firm* — Slater & Matsil, L.L.P.

(57) ABSTRACT

A photoactive component includes organic layers, including a single, tandem or multiple cell with two electrodes and, between the electrodes, a photoactive acceptor-donor layer system that includes at least three absorber materials. At least two absorber materials are donors or acceptors. One of the two absorber materials is configured as donors or acceptors absorbing at greater wavelengths than the other absorber material and one of the two absorber materials have a lower Stokes shift and/or a lower absorption width than the other absorber material.

20 Claims, 5 Drawing Sheets

(56) References Cited

U.S. PATENT DOCUMENTS

| | | | |
|---|---|---|---|
| 2005/0061232 A1 | 3/2005 | Werner et al. | |
| 2005/0110005 A1 | 5/2005 | Forrest et al. | |
| 2005/0121667 A1 | 6/2005 | Kuehl et al. | |
| 2005/0139810 A1 | 6/2005 | Kuehl et al. | |
| 2007/0090371 A1* | 4/2007 | Drechsel et al. | 257/79 |
| 2007/0278479 A1 | 12/2007 | Werner et al. | |
| 2009/0212280 A1 | 8/2009 | Werner et al. | |
| 2009/0217980 A1* | 9/2009 | Pfeiffer et al. | 136/263 |
| 2010/0084011 A1* | 4/2010 | Forrest et al. | 136/255 |

FOREIGN PATENT DOCUMENTS

| | | |
|---|---|---|
| DE | 103 47 856 A1 | 6/2005 |
| DE | 103 57 044 A1 | 7/2005 |
| DE | 10 2004 010 954 A1 | 10/2005 |
| DE | 10 2006 053 320 A1 | 5/2008 |
| DE | 10 2006 054 524 A1 | 5/2008 |
| DE | 10 2008 051 737 A1 | 5/2009 |
| EP | 0 000 829 A1 | 2/1979 |
| EP | 2 037 528 A1 | 3/2009 |
| JP | 201067642 A | 3/2010 |
| WO | WO 2004/083958 A2 | 9/2004 |
| WO | WO 2006/092134 A1 | 9/2006 |
| WO | WO 2007/024695 A1 | 3/2007 |
| WO | WO 2010/036963 A1 | 4/2010 |

OTHER PUBLICATIONS

Wienk et al., Angew. Chem. Int. Ed. 42 (2003) 3371-3375.*

Ameri, T., et al., "Organic tandem solar cells: A review," Energy & Environmental Science, vol. 2, 2009, pp. 347-363, The Royal Society of Chemistry.

Bruder, I., et al., "Efficient organic tandem cell combining a solid state dye-sensitized and a vacuum deposited bulk heterojunction solar cell," Solar Energy Materials and Solar Cells, vol. 93, No. 10, Oct. 1, 2009, pp. 1896-1899, Elsevier Science Publishers.

Castro, F., et al., "On the use of cyanine dyes as low bandgap materials in bulk heterojunction photovoltaic devices" Synthetic Metals, vol. 156, Jul. 1, 2006, pp. 973-978, Elsevier.

Hiramoto, M. et al., "Effect of thin gold interstitial-layer on the photovoltaic properties of tandem organic solar cell,"Chemistry Letters, 1990, pp. 327-330, The Chemical Society of Japan.

Hiramoto, M. et al., "Organic Solar Cells incorporating a $p$-$i$-$n$ junction," Molecular Crystals and Liquid Crystals, vol. 444, No. 1, Aug. 20, 2006, pp. 33-40, Taylor & Francis, LLC.

Hiramoto, M., et al., "Three-layered organic solar cell with a photoactive interlayer of codeposited pigments," Applied Physics Letters, vol. 58, No. 10, Mar. 11, 1991, pp. 1062-1064, American Institute of Physics.

Pfeiffer, M., "Controlled Doping of Organic Vacuum Deposited Dye Layers: Basics and Applications," University of Dresden, PhD Thesis, 1999, 149 pages.

Roman, L.S., et al., "Trapping Light in Polymer Photodiodes with Soft Embossed Gratings," Advanced Materials, vol. 12, No. 3, Feb. 3, 2000, pp. 189-195.

Tang, C.W., "Two-layer organic photovoltaic cell," Applied Physics Letters, vol. 48, No. 2, Jan. 13, 1986, 4 pages, American Institute of Physics.

Yamanari, T., et al., "Dye-Sensitized Bulk Heterojunction Polymer Solar Cells," Conference Record of the 2006 IEEE 4th World Conference on Photovoltaic Energy Conversion, vol. 1, May 2006, pp. 240-243.

* cited by examiner

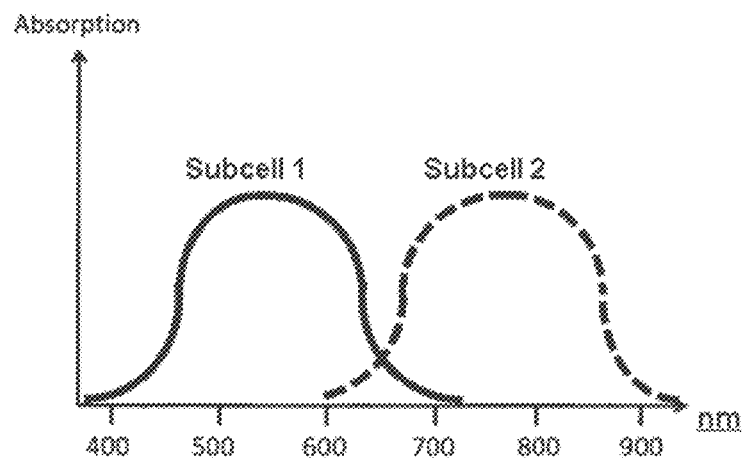
Fig.1 (State of the art)
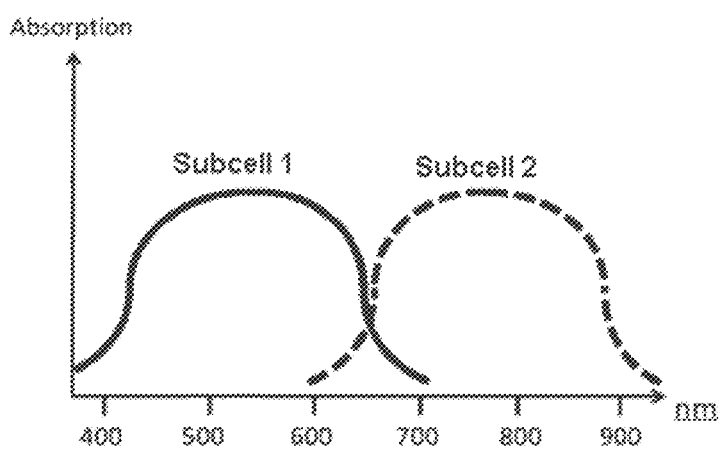
Fig.2
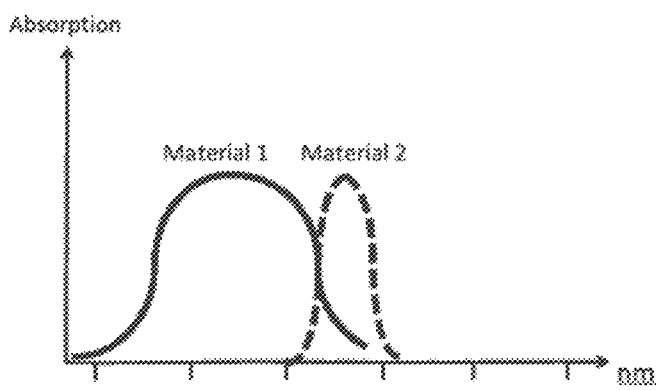
Fig.3

PHOTOACTIVE COMPONENT COMPRISING ORGANIC LAYERS

This patent application is a national phase filing under section 371 of PCT/EP2011/002221, filed May 4, 2011, which claims the priority of European patent application 10161920.3, filed May 4, 2010, each of which is incorporated herein by reference in its entirety.

TECHNICAL FIELD

The invention relates to a photoactive component comprising organic layers, consisting of a single, tandem or multiple cell with two electrodes and, between the electrodes, a photoactive acceptor-donor layer system comprising at least three absorber materials.

BACKGROUND

Since the demonstration of the first organic solar cell with an efficiency in the percent range by Tang, et al. in 1986 [C. W. Tang, et al. Appl. Phys. Lett. 48, 183 (1986)], organic materials have been studied intensively for various electronic and optoelectronic components. Organic solar cells consist of a sequence of thin layers (typically 1 nm to 1 µm) of organic materials, which are preferably vapor-deposited under reduced pressure or spun on from a solution. The electrical contacts can be established by metal layers, transparent conductive oxides (TCOs) and/or transparent conductive polymers (PEDOT-PSS, PANI).

A solar cell converts light energy to electrical energy. The term "photoactive" here likewise signifies the conversion of light energy to electrical energy. In contrast to inorganic solar cells, the light does not directly generate free charge carriers in organic solar cells; instead, excitons are formed at first, i.e., electrically neutral excitation states (bound electron-hole pairs). Only in a second step are these excitons separated into free charge carriers, which then contribute to electrical current flow.

The advantage of such organic-based components over the conventional inorganic-based components (semiconductors such as silicon, gallium arsenide) is that the optical absorption coefficients are in some cases extremely high (up to 2×105 cm-1), and so it is possible to produce very thin solar cells with low material consumption and energy expenditure. Further technological aspects are low costs, the possibility of producing flexible large-area components on plastic films, and the virtually unlimited possible variations and the unlimited availability of organic chemistry.

One possible implementation of an organic solar cell which has already been proposed in the literature is that of a pin diode [Martin Pfeiffer, "Controlled doping of organic vacuum deposited dye layers: basics and applications," PhD thesis TU-Dresden, 1999] with the following layer structure:
0. carrier, substrate,
1. base contact, usually transparent,
2. p layer(s),
3. i layer(s),
4. n layer(s),
5. top contact.

In this context, n and p mean n- and p-doping respectively, this leading to an increase in the density of, respectively, free electrons and holes in the thermal equilibrium state. However, it is also possible that the n layer(s) or p layer(s) are at least partially nominally undoped and have preferentially n-conducting or preferentially p-conducting properties solely due to the material properties (for example different mobilities), due to unknown impurities (for example remaining residues from the synthesis, decomposition or reaction products during layer production) or due to environmental influences (for example adjoining layers, inward diffusion of metals or other organic materials, gas doping from the ambient atmosphere). In this context, such layers should be understood primarily to be transport layers. The term "i layer," in contrast, denotes a nominally undoped layer (intrinsic layer). In this context, one or more i layers may layers consist either of one material or of a mixture of two materials (called interpenetrating networks or a bulk heterojunction; M. Hiramoto, et al. Mol. Cryst. Liq. Cryst., 2006, 444, pp. 33-40). The light incident through the transparent base contact produces excitons (bound electron-hole pairs) in the i layer or in the n/p layer. These excitons can be separated only by very high electrical fields or at suitable interfaces. In organic solar cells, sufficiently high fields are not available, and so all promising concepts for organic solar cells are based on exciton separation at photoactive interfaces. As a result of diffusion, the excitons arrive at such an active interface, where electrons and holes are separated from one another. The material which absorbs the electrons is referred to as the acceptor, and the material which absorbs the hole as the donor. The separating interface may be between the p (n) layer and the i layer, or between two i layers. In the installed electrical field of the solar cell, the electrodes are then transported away to the n region and the holes to the p region. The transport layers are preferably transparent or substantially transparent materials with a wide band gap, as described, for example, in WO 2004/083958. Wide-gap materials refer here to materials whose absorption maximum is in the wavelength range of <450 nm, preferably at <400 nm.

Since the light always first produces excitons and no free charge carriers as yet, the low-recombination diffusion of excitons to the active interface plays a critical role in organic solar cells. In order to make a contribution to the photocurrent, the exciton diffusion length in a good organic solar cell must therefore significantly exceed the typical penetration depth of light in order that the predominant portion of the light can be utilized. Thin layers or organic crystals perfect in terms of structure and with regard to chemical purity do indeed meet this criterion. For large-area applications, however, the use of monocrystalline organic materials is impossible and the production of multiple layers with sufficient structural perfection is still very difficult to date.

If the i layer is a mixed layer, the task of light absorption is assumed either by only one of the components or else by both. The advantage of mixed layers is that the excitons produced have to cover only a very short distance before arriving at the domain boundary where they are separated. The electrons or holes are transported away separately in the respective materials. Since the materials are in contact with one another throughout the mixed layer, it is crucial in this concept that the separate charges have a long lifetime on the respective material and continuous percolation pathways exist for both charge carrier types from any site toward the respective contact.

U.S. Pat. No. 5,093,698 discloses the doping of organic materials. Addition of an acceptor-type or donor-type doping substance increases the equilibrium charge carrier concentration in the layer and enhances the conductivity. According to U.S. Pat. No. 5,093,698, the doped layers are used as injection layers at the interface to the contact materials in electroluminescent components. Similar doping approaches are also appropriate analogously for solar cells.

The literature discloses various possible ways of implementing the photoactive i layer. For instance, it may be a double layer (EP Patent Document 0000829) or a mixed layer (Hiramoto, Appl. Phys. Lett. 58, 1062 (1991)). Also known is a combination of double and mixed layers (Hiramoto, Appl. Phys. Lett. 58, 1062 (1991); U.S. Pat. No. 6,559,375). It is likewise known that the mixing ratio is different in different regions of the mixed layer (U.S. Patent Publication No. 2005/0110005), and that the mixing ratio has a gradient.

Also known from the literature are tandem or multiple solar cells (Hiramoto, Chem. Lett., 1990, 327 (1990); DE 102004014046).

Additionally known from the literature are organic pin tandem cells (DE Patent Publication 102004014046): the structure of such a tandem cell consists of two individual pin cells, the layer sequence "pin" describing the sequence of a p-doped layer system, an undoped photoactive layer system and an n-doped layer system. The doped layer systems preferably consist of transparent materials, called wide-gap materials/layers, and in this case they may also be partly or wholly undoped or else have different dopant concentrations as a function of location, or have a continuous gradient in the dopant concentration. Specifically, regions with very low doping or high doping are also possible in the boundary region to the electrodes, in the boundary region to another doped or undoped transport layer, in the boundary region to the active layers or, in the case of tandem or multiple cells, in the boundary region to the adjoining pin or nip subcell, i.e., in the region of the recombination zone. Any desired combination of all these features is also possible. Of course, such a tandem cell may also be what is called an inverted structure (e.g., nip tandem cell). All these possible tandem cell implementation forms are referred to hereinafter by the term "pin tandem cells."

In the context of the present invention, small molecules are understood to mean nonpolymeric organic molecules with monodisperse molar masses between 100 and 2000, which are in the solid phase under standard pressure (air pressure of the ambient atmosphere) and at room temperature. More particularly, these small molecules may also be photoactive, "photoactive" being understood to mean that the molecules change their charge state under incidence of light.

The problem with organic solar cells is currently that even the highest efficiencies of 6-7% achieved to date in the laboratory are still too low. For most applications, specifically large-area applications, an efficiency of approx. 10% is considered to be necessary. Due to the relative poor transport properties of organic semiconductors (as compared with inorganic semiconductors) and the associated limitation in the layer thicknesses of the absorbers usable in organic solar cells, it is generally assumed that such efficiencies can best be implemented with the aid of tandem cells (Tayebeh Ameri, et al., Organic tandem solar cells: A review, Energy Environ. Sci., 2009, 2, 347-363; DE 102004014046.4). Specifically, efficiencies up to 15% will probably be possible in future only with the aid of tandem cells. In the conventional construction of such a tandem solar cell, various absorber systems are used in the two subcells, these absorbing in different parts (possibly even overlapping) of the solar spectrum in order to exploit a maximum range. The absorber system of one subcell absorbs here in the shorter-wave spectral range (preferably in the visible range) and the absorber system of the other subcell in the longer-wave spectral range (preferably in the infrared range). FIG. 1 shows the schematic distribution of the absorption spectra in the two subcells of a tandem cell of conventional construction.

The disadvantage of these tandem cells is that the subcell with the infrared absorber delivers a lower open-circuit voltage than the other subcell, and this subcell can thus make only a relatively small contribution to the efficiency of the component.

SUMMARY OF THE INVENTION

In one aspect, the present invention specifies an organic photoactive component which overcomes the disadvantages indicated.

BRIEF DESCRIPTION OF DRAWINGS

The invention is to be illustrated in more detail below. The figures show:

FIG. 1 is a schematic diagram of the distribution of the absorption spectra in the two subcells of a tandem cell with conventional construction according to the prior art;

FIG. 2 is a schematic diagram of the distribution of the absorption spectra in the two subcells in an inventive tandem cell, with absorption widths of the respective absorber systems of at least 200 nm to 250 nm;

FIG. 3 is an illustrative schematic diagram of a possible profile of the absorption spectra of materials 1 and 2 in an inventive single cell;

DETAILED DESCRIPTION OF ILLUSTRATIVE EMBODIMENTS

Figure 4:
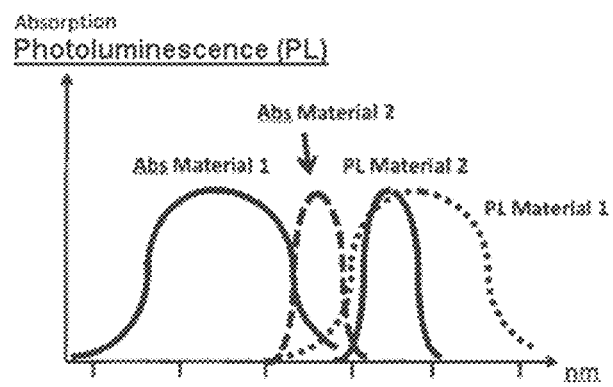
FIG. 4 is an illustrative schematic diagram of a possible profile of the absorption and photoluminescence spectra of a material 1 and of a material 2 in an inventive single cell.

The inventive component, which takes the form of a single, tandem or multiple cell, has two electrodes, one electrode being arranged on a substrate and one as a top counterelectrode. Between the electrodes is a photoactive acceptor-donor layer system as an absorber system, which has at least three absorber materials. At least two absorber materials are donors or acceptors, one of the two absorber materials which take the form of donors or acceptors absorbing at greater wavelengths than the other absorber material, and one of the two absorber materials having a smaller Stokes shift and/or a smaller absorption width than the other absorber material.

The Stokes shift is defined in the context of the invention as the distance in nm between the maximum absorption and the maximum photoluminescence.

A donor refers to a material which releases electrons. An acceptor refers to a material which absorbs electrons.

Absorber materials are understood to mean materials which absorb in the wavelength range of >400 nm.

The absorption width or absorption range of an organic film is understood here to mean the half-height width (width at 50% of the local absorption maximum) in nm of a local absorption maximum, or the width of the absorption spectrum in nm at the value of 20% of the local absorption maximum. It is within the scope of the invention when at least one of the two definitions applies.

In one embodiment of the invention, the photoactive layer system has at least three absorber materials 1, 2, 3, absorber material 1 and absorber material 2 being donors and absorber material 3 being an acceptor. In this case, absorber material 2 has a smaller Stokes shift than absorber material 1.

In one embodiment of the invention, the photoactive layer system has at least three absorber materials 1, 2, 3, absorber material 1 and absorber material 2 being acceptors and absorber material 3 being a donor. In this case, absorber material 2 has a smaller Stokes shift than absorber material 1.

In one embodiment of the invention, the photoactive layer system has at least three absorber materials 1, 2, 3, absorber material 1 and absorber material 2 being donors and absorber material 3 being an acceptor. In this case, absorber material 2 has a smaller absorption width than absorber material 1.

In one embodiment of the invention, one of the at least two absorber materials which take the form of donors or acceptors in the absorber system has a lower absorption width than the other absorber material.

In one embodiment of the invention, the photoactive layer system has at least three absorber materials 1, 2, 3, absorber material 1 and absorber material 2 being acceptors and absorber material 3 being a donor. In this case, absorber material 2 has a smaller absorption width than absorber material 1.

In one embodiment of the invention, the absorber system consists of a donor-acceptor system, the absorption width of the absorber system having a width of at least 200 nm to 250 nm.

In one embodiment of the invention, the absorber system consists of a photoactive acceptor-donor layer system with at least three absorber materials 1, 2, 3. Absorber material 1 and absorber material 2 are either both donors or both acceptors, absorber material 2 absorbing at greater wavelengths than absorber material 1, and absorber material 2 having a smaller Stokes shift and/or a smaller absorption width than absorber material 1.

In a further embodiment of the invention, the absorber system consists of a photoactive acceptor-donor layer system comprising at least three absorber materials 1, 2, 3.

Absorber material 1 and absorber material 2 are either both donors or both acceptors, absorber material 2 absorbing at smaller wavelengths than absorber material 1, and absorber material 2 having a smaller Stokes shift and/or a smaller absorption width than absorber material 1.

In one embodiment of the invention, one of the at least two absorber materials which take the form of donors or acceptors in the absorber system absorbs at greater wavelengths than the other absorber material.

In one embodiment of the invention, the absorber system comprises at least two absorber materials 1, 2, the second absorber material 2 absorbing at greater wavelengths than absorber material 1.

In one embodiment of the invention, one of the at least two absorber materials which take the form of donors or acceptors in the absorber system absorbs at smaller wavelengths than the other absorber material.

In a further embodiment of the invention, the second absorber material 2 has a narrower absorption range than the first absorber material 1.

The advantage of this inventive construction is that the solar cells can deliver a higher open-circuit voltage for the same absorption range compared to the prior art.

In order to generate sufficient power overall that the efficiency of the solar cell can be 10% or more, the absorption widths of the respective absorber systems in tandem or multiple cells must have a width of at least 200 nm to 250 nm. For example, one subcell may absorb from 400 nm to 650 nm and the other subcell from 650 nm to 900 nm (FIG. 2).

In a further embodiment, the component is configured as an organic pin solar cell or organic pin tandem solar cell. A tandem solar cell refers to a solar cell which consists of a vertical stack of two series-connected solar cells.

In one embodiment of the invention, the first absorber material 1 and the second absorber material 2 are either both donors or both acceptors.

In a further embodiment of the invention, the second absorber material 2 has a smaller Stokes shift than the first absorber material 1.

In a further embodiment of the invention, the first absorber material 1 and/or the second absorber material 2 are present at least partly in a mixed layer.

In a further embodiment of the invention, at least two absorber materials of the absorber system are present at least partly in a mixed layer.

In a further embodiment of the invention, the HOMO levels of one of the at least two absorber materials which take the form of donors or acceptors in the absorber system differ by not more than 0.2 eV from the other absorber material, preferably by not more than 0.1 eV. For example, the HOMO levels of absorber material 2 and of absorber material 1 differ by not more than 0.2 eV, preferably by not more than 0.1 eV. If absorber material 2 absorbs at longer wavelengths than absorber material 1, absorber material 2 will generally limit the open-circuit voltage, and the HOMO level of absorber material 2 should not be much higher than for absorber material 1 in order not to lose voltage unnecessarily.

In a further embodiment of the invention, one or more undoped, partly doped or fully doped transport layers are also present in the component. These transport layers preferably have a maximum absorption at <450 nm, very preferably <400 nm.

In a further embodiment of the invention, at least one further absorber material (absorber material 3) is present in the absorber system, and two or more of absorber materials 1, 2 and 3 have different optical absorption spectra which complement one another in order to cover a spectral range of maximum width.

In a further embodiment of the invention, the absorption range of at least one of absorber materials 1, 2 and 3 extends into the infrared range in the wavelength range from >700 nm to 1500 nm.

In a further embodiment of the invention, at least one of absorber materials 1, 2 and 3 is an absorber material selected from the class consisting of fullerenes or fullerene derivatives, phthalocyanines, perylene derivatives, TPD derivatives or oligothiophene derivatives.

In a further embodiment of the invention, the component consists of a tandem or multiple cell. The component preferably consists of a combination of nip, ni, ip, pnip, pni, pip, nipn, nin, ipn, pnipn, pnin or pipn structures in which two or more independent combinations containing at least one i layer are stacked one on top of another.

In a further embodiment of the invention, the layers of the layer system of the component take the form of a light trap which extends the optical path of the incident light.

In a further embodiment of the invention, the organic materials used are small molecules. In the context of the present invention, small molecules are understood to mean nonpolymeric organic molecules which have monodisperse molar masses between 100 and 2000 and which are in the solid phase under standard pressure (air pressure of the ambient atmosphere) and at room temperature. More particularly, these small molecules may also be photoactive, "photoactive" being understood to mean that the molecules change their charge state under incidence of light.

In a further embodiment of the invention, the organic materials used are at least partly polymers.

In a further embodiment of the invention, the organic layers consist at least partly of small molecules, at least partly of polymers or of a combination of small molecules and polymers.

In a further embodiment of the invention, the component is semitransparent at least within a certain light wavelength range.

In a further embodiment of the invention, the component is used on flat, curved or flexible carrier surfaces. These carrier surfaces are preferably plastic films or metal foils (e.g., aluminum, steel, etc.).

In a further embodiment of the invention, the component is implemented in the form of a tandem cell. In tandem cells, it is important that both subcells absorb to an equal degree and/or generate equal amounts of power. This is because, if the absorption in one subcell is too narrow, the subcell in question does not generate enough power, and since the lower current is limited in a tandem cell, the overall component has a lower efficiency. The problem with an organic absorber with a broader absorption is, however, that the photoluminescence is then also shifted further and the Stokes shift is greater. A greater Stokes shift, however, means a greater energy loss in the material (due to reorganization processes; the photoluminescence level is an indicator of how much energy is present in the system). This means ultimately that only a lower open-circuit voltage is achievable with materials having a relatively broad absorption (for the same maximum absorption wavelength). This directly gives rise to a problem for infrared absorbers: due to the small band gap, the open-circuit voltage achievable is in any case already lower. However, in order that the subcell with the infrared absorber system now generates just as much current as the other subcell, the infrared absorber must likewise have a broad absorption, which gives rise to a very small open-circuit voltage overall. The effect of this is that, with such a system, the aim of 10% efficiency is achievable only with very great difficulty, if at all. In one embodiment of the invention, this problem is solved by virtue of the absorber system consisting of a combination of a broad-absorbing material (material 1) which absorbs at shorter wavelengths (preferably VIS) and hence can deliver a relatively high open-circuit voltage, and of a narrow-absorbing material (material 2) which absorbs at longer wavelengths (preferably infrared), but due to the small Stokes shift can likewise deliver the same open-circuit voltage as material 1 (FIG. 3).

In one embodiment of the invention, the absorption width of absorber material 2 is 20 nm to 250 nm narrower than the absorption width of absorber material 1, more preferably 50 nm to 100 nm.

In one embodiment of the invention, the second absorber material 2 has a higher or very high absorption (maximum optical density value) compared to the first absorber material 1.

In one embodiment of the invention, the preferred structure of an inventive photoactive component comprises a combination of a broad-absorbing absorber material (material 1) which absorbs at relatively short wavelengths (preferably VIS) and of a narrow-absorbing absorber material (material 2) which absorbs at longer wavelengths (preferably infrared). In this case, materials 1 and 2 may be present as individual layers or as mixed layers, or any desired combinations.

In one embodiment of the invention, both absorber materials 1 and 2 are either donors or acceptors. The absorber system consists of at least three absorber materials, absorber material 3 being a donor in the case that absorber materials 1 and 2 are acceptors, or absorber material 3 being an acceptor if absorber materials 1 and 2 are donors.

The absorber system of an inventive photoactive component, when implemented as a single cell, may have one of the following structures, where IL=individual layer and ML=mixed layer:

IL material 1/IL material 2/IL material 3
IL material 2/IL material 1/IL material 3
ML material 1/IL material 2
ML material 1/IL material 2/IL material 3
IL material 3/ML material 1/IL material 2
ML material 2/IL material 1
ML material 2/IL material 1/IL material 3
IL material 3/ML material 2/IL material 1
ML material 1/ML material 2
ML material 1/ML material 2/IL material 3
ML material 2/ML material 1/IL material 3
Three-component mixed layer composed of materials 1, 2 and 3.

In one embodiment of the invention, an inventive photoactive component, when implemented as a tandem or multiple cell, is implemented as follows:

The first subcell comprises a combination of a broad-absorbing material (material 1) and of a narrow-absorbing material (material 2) which absorbs at longer wavelengths than material 1 and the second subcell comprises a combination of a broad-absorbing material (material 4) and of a narrow-absorbing material (material 5) which absorbs at longer wavelengths than material 4.

In one embodiment of the invention, materials 1 and 2 absorb in the visible wavelength range (VIS) and materials 4 and 5 in the infrared range (IR).

The tandem cell thus absorbs both in the VIS and in the IR range in each subcell and thus in turn covers, as in the conventional tandem structure, a broad range of the solar spectrum (preferably from 400 nm to 900 nm) and thus delivers a large current. Due to the specific inventive structure of these tandem cells, however, both subcells can deliver a large open-circuit voltage and the efficiency is thus higher compared to a tandem cell with the conventional structure.

In one embodiment of the invention, in an inventive tandem cell, both materials 1 and 2 or 4 and 5 are each either donors or acceptors. For example, the absorber system 1 of subcell 1 may have one of the following structures (IL=individual layer; ML=mixed layer; material):

IL material 1/IL material 2/IL material 3
IL material 2/IL material 1/IL material 3
ML material 1/IL material 2
ML material 1/IL material 2/IL material 3
IL material 3/ML material 1/IL material 2
ML material 2/IL material 1
ML material 2/IL material 1/IL material 3
IL material 3/ML material 2/IL material 1
ML material 1/ML material 2
ML material 1/ML material 2/IL material 3
ML material 2/ML material 1/IL material 3

Three-component mixed layer composed of materials 1, 2 and 3.

And absorber system 2 of subcell 2 may have the following structure:

IL material 4/IL material 5/IL material 6
IL material 5/IL material 4/IL material 6
ML material 4/IL material 5
ML material 4/IL material 5/IL material 6
IL material 6/ML material 4/IL material 5
ML material 5/IL material 4
ML material 5/IL material 4/IL material 6
IL material 6/ML material 5/IL material 4
ML material 4/ML material 5
ML material 4/ML material 5/IL material 6
ML material 5/ML material 4/IL material 6

Three-component mixed layer composed of materials 4, 5 and 6.

In one embodiment of the invention, material 6 is a donor if materials 4 and 5 are acceptors, and material 6 is an acceptor if materials 4 and 5 are donors.

In one embodiment of the invention, materials 3 and 6 may also be identical. It is also possible for one or more of materials 1, 2, 4 and 5 to be identical.

The tandem cell or multiple cell composed of more than two subcells may then be any combination of the above structures of subcells 1 and 2.

In a further embodiment of the invention, at least one of the photoactive mixed layers comprises, as an acceptor, a material from the group of the fullerenes or fullerene derivatives ($C_{60}$, $C_{70}$, etc.).

In a further embodiment of the invention, at least one of the photoactive mixed layers comprises, as a donor, a material from the class of the phthalocyanines, perylene derivatives, TPD derivatives, oligothiophenes or a material as described in WO 2006/092134.

In a further embodiment of the invention, at least one of the photoactive mixed layers comprises the material fullerene $C_{60}$ as an acceptor, and the material 4P-TPD as a donor.

In a further embodiment of the invention, the contacts consist of metal, a conductive oxide, especially ITO, ZnO:Al or other TCOs or a conductive polymer, especially PEDOT:PSS or PANI.

In multiple mixed layer systems, an increased level of transport problems occurs for the charge carriers. This transport is considerably facilitated by the installed field of the pin structure. In addition, the multiple mixed layers within a pin structure can be shifted with doped wide-gap transport layers in order to achieve optimal absorption. For this purpose, it may also be very advantageous to change the pin structure to a nip structure. Specifically when the different materials in the multiple mixed layers absorb in different wavelength ranges, a suitable selection of the structure (pin or nip) or a suitable selection of the layer thicknesses of the transport layers allows the different materials each to be positioned at the optimal position with respect to the intensity distribution of the light within the component. Specifically in the case of tandem cells, this optimization is very important in order to achieve balancing of the photocurrents of the individual cells and thus to achieve maximum efficiency.

In a further embodiment of the inventive component, a p-doped layer is also present between the first electron-conducting layer (n layer) and the electrode present on the substrate, such that the structure is a pnip or pni structure, the doping preferably being selected at such a level that the direct pn contact does not have a barrier effect but results in a low-loss recombination, preferably through a tunneling process.

In a further embodiment of the invention, a p-doped layer may also be present in the component between the photoactive i layer and the electrode present on the substrate, such that the structure is a pip or pi structure, the additional p-doped layer having a Fermi level which is at most 0.4 eV, but preferably less than 0.3 eV, below the electron transport level of the i layer, such that there can be low-loss electron extraction from the i layer into this p layer.

In a further embodiment of the inventive component, an n-layer system is also present between the p-doped layer and the opposite electrode, such that the structure is an nipn or ipn structure, the doping preferably being selected at such a level that the direct pn contact does not have a barrier effect but results in low-loss recombination, preferably through a tunneling process.

In a further embodiment, an n layer system may also be present in the component between the intrinsic, photoactive layer and the opposite electrode, such that the structure is an nin or in structure, the additional n-doped layer having a Fermi level which is at most 0.4 eV, but preferably less than 0.3 eV, above the hole transport level of the i layer, such that there can be low-loss hole extraction from the i layer into this n layer.

In a further embodiment of the inventive component, the component comprises an n layer system and/or a p layer system, such that the structure is a pnipn, pnin, pipn or p-i-n structure, which in all cases has the feature that—irrespective of the conduction type—the layer adjoining the photoactive i layer on the substrate side has a lower thermal work function than the layer adjoining the i layer on the side remote from the substrate, such that photogenerated electrons are preferably transported away toward the substrate when no external voltage is applied to the component.

In a preferred development of the above-described structures, these are executed as an organic tandem solar cell or multiple solar cell. For instance, the component may be a tandem cell composed of a combination of nip, ni, ip, pnip, pni, pip, nipn, nin, ipn, pnipn, pnin or pipn structures in which several independent combinations comprising at least one i layer are stacked one on top of another (cross combinations).

In a particularly preferred embodiment of the above-described structures, it is configured as a pnipnipn tandem cell.

In a further embodiment, the acceptor material in the mixed layer is at least partly in crystalline form.

In a further embodiment, the donor material in the mixed layer is at least partly in crystalline form.

In a further embodiment, both the acceptor material and the donor material in the mixed layer are at least partly in crystalline form.

In a further embodiment the acceptor material has an absorption maximum in the wavelength range of >450 nm.

In a further embodiment the donor material has an absorption maximum in the wavelength range of >450 nm.

In a further embodiment, the photoactive i layer system, in addition to the mixed layer mentioned, also comprises further photoactive individual or mixed layers.

In a further embodiment, the n material system consists of one or more layers.

In a further embodiment, the p material system consists of one or more layers.

In a further embodiment, the donor material is an oligomer, especially an oligomer according to WO 2006/092134, a porphyrin derivative, a pentacene derivative or a perylene derivative, such as DIP (diindenoperylene), DBP (dibenzoperylene).

In a further embodiment, the p material system comprises a TPD derivative (triphenylamine dimer), a spiro compound such as spiropyrans, spiroxazines, MeO-TPD (N,N,N',N'-tetrakis(4-methoxyphenyl)benzidine), di-NPB (N,N'-diphenyl-N,N'-bis(N,N'-di(1-naphthyl)-N,N'-diphenyl(1,1'-biphenyl)-4,4'-diamine), MTDATA (4,4',4"-tris-(N-3-methylphenyl-N-phenylamino)triphenylamine), TNATA (4,4',4"-tris[N-(1-naphthyl)-N-phenylamino] triphenylamine), BPAPF (9,9-bis{4-[di(p-biphenyl)aminophenyl]} fluorene), NPAPF (9,9-bis[4-(N,N'-bisnaphthalen-2-ylamino)phenyl]-9H-fluorene), spiro-TAD (2,2',7,7'-tetrakis (diphenylamino)-9,9'-spirobifluorene), PV-TPD (N,N-di-4-(2,2-diphenylethen-1-yl)phenyl-N,N-di-4-methylphenylphenylbenzidine), 4P-TPD (4,4'-bis(N,N-diphenylamino)tetraphenyl), or a p material described in DE 102004014046.

In a further embodiment, the n material system comprises fullerenes, for example C60, C70; NTCDA (1,4,5,8-naphthalenetetracarboxylic dianhydride), NTCDI (naphthalenetetracarboxylic diimide) or PTCDI (perylene-3,4,9,10-bis(dicarboximide)).

In a further embodiment, the p material system comprises a p-dopant, this p-dopant being F4-TCNQ, a p-dopant as described in DE 10338406, DE 10347856, DE 10357044, DE 102004010954, DE 102006053320, DE 102006054524 and DE 102008051737, or a transition metal oxide (VO, WO, MoO, etc.).

In a further embodiment, the n material system comprises an n-dopant, this n-dopant being a TTF derivative (tetrathiafulvalene derivative) or DTT derivative (dithienothiophene), an n-dopant as described in DE 10338406, DE 10347856, DE 10357044, DE 102004010954, DE 102006053320, DE 102006054524 and DE 102008051737, or Cs, Li or Mg.

In a further embodiment, one electrode is transparent when a transmission of >80% and the other electrode is reflective with a reflection of >50%.

In a further embodiment, the component is semitransparent with a transmission of 10-80%.

In a further embodiment, the electrodes consist of a metal (e.g., Al, Ag, Au or a combination thereof), a conductive oxide, especially ITO, ZnO:Al or another TCO (transparent conductive oxide), a conductive polymer, especially PEDOT/PSS (poly(3,4-ethylenedioxythiophene) poly(styrenesulfonate)) or PANI (polyaniline), or a combination of these materials.

In a further embodiment, the light trap is implemented by virtue of the component being formed on a periodically microstructured substrate, and the homogeneous function of the component, i.e., short circuit-free contact connection and homogeneous distribution of the electrical field over the entire area, being ensured through the use of a doped wide-gap layer. Ultrathin components have an increased risk of formation of local short circuits on structured substrates, and so such obvious inhomogeneity ultimately endangers the functionality of the overall component. This short-circuit risk is reduced by the use of the doped transport layers.

In a further embodiment of the invention, the light trap is implemented by virtue of the component being formed on a periodically microstructured substrate, and the homogeneous function of the component, the short circuit-free contact connection thereof and homogeneous distribution of the electrical field over the entire area being ensured by the use of a doped wide-gap layer. It is particularly advantageous that the light passes through the absorber layer at least twice, which can lead to an increase in light absorption and thus to an improvement in efficiency of the solar cell. This can be achieved, for example, by virtue of the substrate having pyramid-like structures on the surface, with heights (h) and widths (w) each in the range from one micrometer up to several hundreds of micrometers. The height and width may be selected identically or differently. It is likewise possible for the pyramids to have symmetric or asymmetric structure.

In a further embodiment of the invention, the light trap is implemented by virtue of a doped wide-gap layer having a smooth interface to the i layer and a rough interface to the reflecting contact. The rough interface can be achieved, for example, by periodic microstructuring. The rough interface is particularly advantageous when it reflects the light in a diffuse manner, which leads to an extension of the light pathway within the photoactive layer.

In a further embodiment, the light trap is implemented by virtue of the component being formed on a periodically microstructured substrate and a doped wide-gap layer having a smooth interface to the i layer and a rough interface to the reflective contact.

In a further embodiment of the invention, the entire structure has been provided with a transparent base contact and top contact.

In a further embodiment of the invention, the photoactive component, especially an organic solar cell, consists of an electrode and an opposite electrode and, between the electrodes, at least two organic photoactive mixed layers, each of the mixed layers comprising at least two materials and the two main materials of each mixed layer having at least one absorber system consisting of a donor-acceptor system, the absorption width of the absorber system having a width of at least 200 nm to 250 nm. The absorber system comprises at least two absorber materials (materials 1 and 2), material 2 absorbing at greater wavelengths than material 1 and material 2 having a narrower absorption range than material 1.

In a further embodiment, the two mixed layers directly adjoin one another, at least one of the two main materials of one mixed layer being an organic material other than the two main materials of another mixed layer.

In a development of the above-described embodiment, several or all main materials of the mixed layers are different than one another.

In a further embodiment of the invention, three or more mixed layers are arranged between the electrode and opposite electrode.

In a further embodiment of the invention, in addition to the mixed layers mentioned, further photoactive individual or mixed layers are present.

In a further embodiment of the invention, at least one further organic layer is also present between the mixed layer system and one electrode.

In a further embodiment of the invention, at least one further organic layer is also present between the mixed layer system and the opposite electrode.

In a further embodiment of the invention, one or more of the further organic layers are doped wide-gap layers, the absorption maximum being at <450 nm.

In a further embodiment of the invention, at least two main materials of the mixed layers have different optical absorption spectra.

In a further embodiment of the invention, the main materials of the mixed layers have different optical absorption spectra which complement one another, in order to cover a maximum spectral range.

In a further embodiment of the invention, the absorption range of at least one of the main materials of the mixed layers extends into the infrared region.

In a further embodiment of the invention, the absorption range of at least one of the main materials of the mixed layers extends into the infrared region in the wavelength range from >700 nm to 1500 nm.

In a further embodiment of the invention, the HOMO and LUMO levels of the main materials are matched such that the system enables a maximum open-circuit voltage, a maximum short-circuit current and a maximum fill factor.

In a further embodiment of the invention, the entire structure has been provided with transparent base and top contacts.

In a further embodiment, the inventive photoactive components are used on curved surfaces, for example concrete, roof tiles, clay, automotive glass, etc. It is advantageous that the inventive organic solar cells, compared to conventional inorganic solar cells, can be applied to flexible carriers such as films, textiles, etc.

In a further embodiment, the inventive photoactive components are applied to a film or textile having a means of adhesion, for example an adhesive, on the side opposite the inventive organic layer system. This makes it possible to produce a solar adhesive film which can be arranged as required on any desired surfaces. It is thus possible to obtain a self-adhesive solar cell.

In a further embodiment, the inventive photoactive components have another means of adhesion in the form of a hook-and-loop connection.

In a further embodiment, the inventive photoactive components are used in conjunction with energy buffers or energy storage medium, for example accumulators, capacitors etc., for connection to loads or devices.

In a further embodiment, the inventive photoactive components are used in combination with thin-film batteries.

In a further embodiment, the inventive photoactive components are applied to a film or textile having a means of adhesion, for example an adhesive, on the side opposite the inventive organic layer system. This makes it possible to produce a solar adhesive film which can be arranged as required on any desired surfaces. It is thus possible to obtain a self-adhesive solar cell.

In a further embodiment, the inventive organic solar cells have another means of adhesion in the form of a hook-and-loop connection.

In a first working example, for illustration of an inventive arrangement, the absorption and photoluminescence spectra of a material 1 and of a material 2 are shown in FIG. 4.

Figure 5:
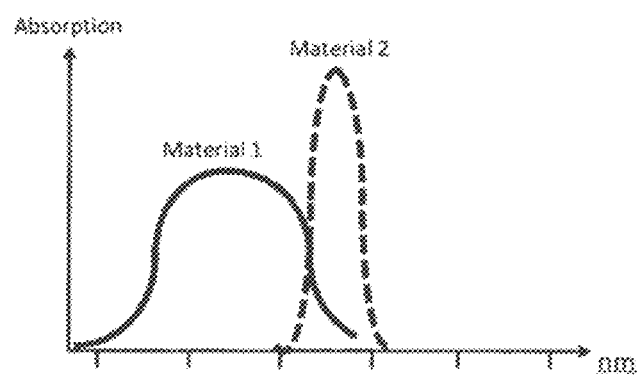
FIG. 5 is an illustrative schematic diagram of a possible profile of the absorption spectra of materials 1 and 2 in an inventive single cell, material 2 having a higher or very high absorption (maximum optical density value) compared to material 1.

In a further working example, material 2 in FIG. 5 has a higher or very high absorption (maximum optical density value) compared to material 1.

In a further working example, the structure of an inventive photoactive component includes a combination of a broad-absorbing material 1 which absorbs at relatively short wavelengths in the visible range, and of a narrow-absorbing material 2 which absorbs at relatively long wavelengths in the infrared range. Materials 1 and 2 are present here as individual layers.

In one configuration of the above working example, materials 1 and 2 are in the form of mixed layers. However, any desired combinations may be present.

In a further working example, both materials 1 and 2 are donors.

In a further working example, both materials 1 and 2 are acceptors.

In a further working example, the absorption range of material 2 is 20 nm to 150 nm narrower than the absorption range of material 1, more preferably 50 nm to 100 nm.

In a further working example, the absorber system consists of three materials, materials 1 and 2 being acceptors and material 3 being a donor.

In a further working example, the absorber system consists of three materials, materials 1 and 2 being donors and material 3 being an acceptor.

In a further working example, the absorber system of the inventive photoactive component, in the implementation as a single cell, has one of the following structures, in which IL=individual layer and ML=mixed layer:

IL material 1/IL material 2/IL material 3
IL material 2/IL material 1/IL material 3
ML material 1/IL material 2
ML material 1/IL material 2/IL material 3
IL material 3/ML material 1/IL material 2
ML material 2/IL material 1
ML material 2/IL material 1/IL material 3
IL material 3/ML material 2/IL material 1
ML material 1/ML material 2
ML material 1/ML material 2/IL material 3
ML material 2/ML material 1/IL material 3

Three-component mixed layer composed of materials 1, 2 and 3.

In a further working example, the first subcell comprises a combination of a broad-absorbing material (material 1) and of a narrow-absorbing material (material 2) which absorbs at longer wavelengths than material 1 and the second subcell comprises a combination of a broad-absorbing material (material 4) and of a narrow-absorbing material (material 5) which absorbs at longer wavelengths than material 4.

Figure 6:
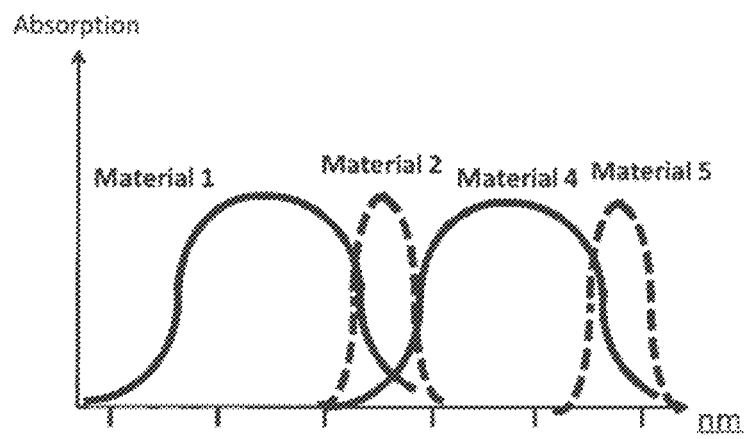
FIG. 6 is an illustrative schematic diagram of the distribution of the absorption spectra of the four materials in the two subcells in an inventive tandem cell.

In a further working example in FIG. 6, materials 1 and 2 absorb in the visible wavelength region (VIS) and materials 4 and 5 in the infrared region (IR).

Figure 7:
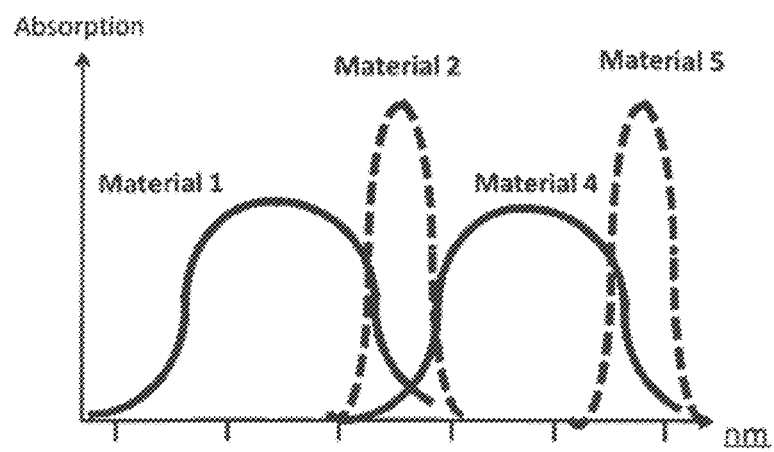
FIG. 7 is an illustrative schematic diagram of the distribution of the absorption spectra of the four materials in the two subcells in an inventive tandem cell, materials 4 and 5 having a higher absorption than materials 1.

In a further working example in FIG. 7, materials 4 and 5 have a higher absorption than materials 1 and 2.

Figure 8:
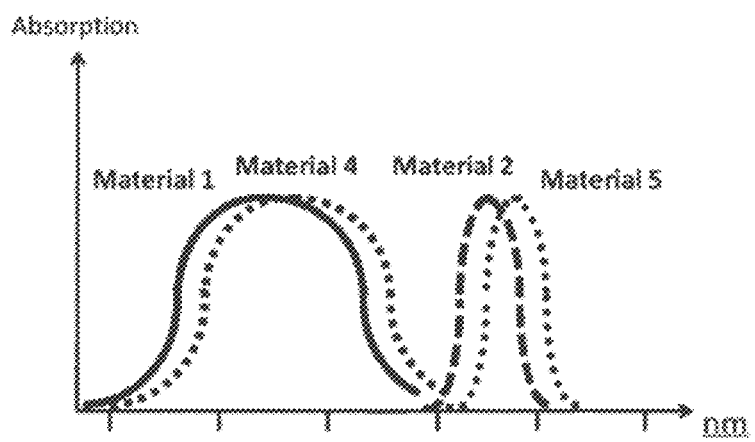
FIG. 8 is a further illustrative schematic diagram of the distribution of the absorption spectra of the four materials in the two subcells in an inventive tandem cell.

In a further working example in FIG. 8, materials 1 and 4 absorb in the visible wavelength region (VIS) and materials 2 and 5 in the infrared region (IR), the absorption spectra of materials 1 and 4, and 2 and 5, having overlapping distribution.

Figure 9:
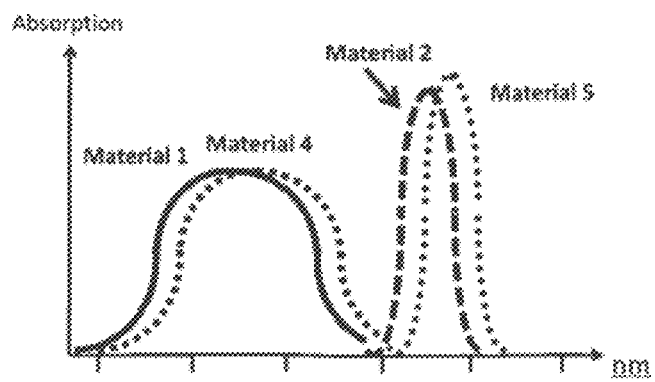
FIG. 9 is a further illustrative schematic diagram of the distribution of the absorption spectra of the four materials in the two subcells in an inventive tandem cell, materials 2 and 5 having a higher absorption than materials 1 and 4.

In a further working example in FIG. 9, materials 1 and 4 absorb in the visible wavelength region (VIS) and materials 2 and 5 in the infrared region (IR), the absorption spectra of materials 1 and 4, and 2 and 5, having overlapping distribution, and materials 4 and 5 having a higher absorption than materials 1 and 2.

Figure 10:
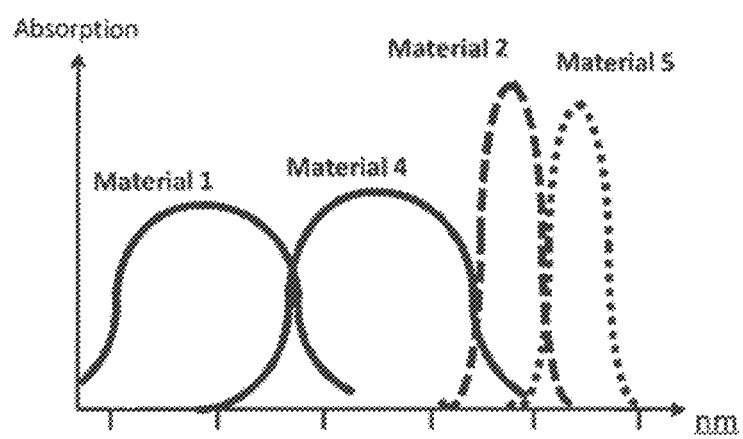
FIG. 10 is a further illustrative schematic diagram of the distribution of the absorption spectra of the four materials in the two subcells in an inventive tandem cell, the four materials covering a broad range of the solar spectrum.

In a further working example in FIG. 10, materials 1 and 4 absorb in the visible wavelength region (VIS) and materials 2 and 5 in the infrared region (IR), materials 2 and 5 having a higher absorption than materials 1 and 4, and materials 1 and 4, and 2 and 5, exhibiting slight overlapping of the absorption ranges.

In a further working example, in an inventive tandem cell, both materials 1 and 2, and 4 and 5, are donors.

In a further working example, in an inventive tandem cell, both materials 1 and 2, and 4 and 5, are acceptors.

In a further working example, the inventive organic component takes the form of a tandem cell, in which case the respective subcells have an absorber system 1 for the first subcell and an absorber system 2 for the second subcell. The absorber system 1 of subcell 1 has one of the following structures (IL=individual layer; ML=mixed layer):

IL material 1/IL material 2/IL material 3
IL material 2/IL material 1/IL material 3
ML material 1/IL material 2
ML material 1/IL material 2/IL material 3
IL material 3/ML material 1/IL material 2
ML material 2/IL material 1
ML material 2/IL material 1/IL material 3
IL material 3/ML material 2/IL material 1
ML material 1/ML material 2
ML material 1/ML material 2/IL material 3
ML material 2/ML material 1/IL material 3

Three-component mixed layer composed of materials 1, 2 and 3.

The absorber system 2 of subcell 2 has one of the following structures (IL=individual layer; ML=mixed layer):

IL material 4/IL material 5/IL material 6
IL material 5/IL material 4/IL material 6
ML material 4/IL material 5
ML material 4/IL material 5/IL material 6
IL material 6/ML material 4/IL material 5
ML material 5/IL material 4
ML material 5/IL material 4/IL material 6
IL material 6/ML material 5/IL material 4
ML material 4/ML material 5
ML material 4/ML material 5/IL material 6
ML material 5/ML material 4/IL material 6

Three-component mixed layer composed of materials 4, 5 and 6.

In a further working example, materials 4 and 5 are acceptors and material 6 is a donor.

In a further working example, materials 4 and 5 are donors and material 6 is an acceptor.

In a further working example, materials 3 and 6 are identical.

In a further working example, one or more of materials 1, 2, 4 and 5 are identical.

In a further working example, at least one of the photoactive mixed layers in one of the subcells comprises the material fullerene $C_{60}$ as an acceptor and the material 4P-TPD as a donor.

Figure 11:
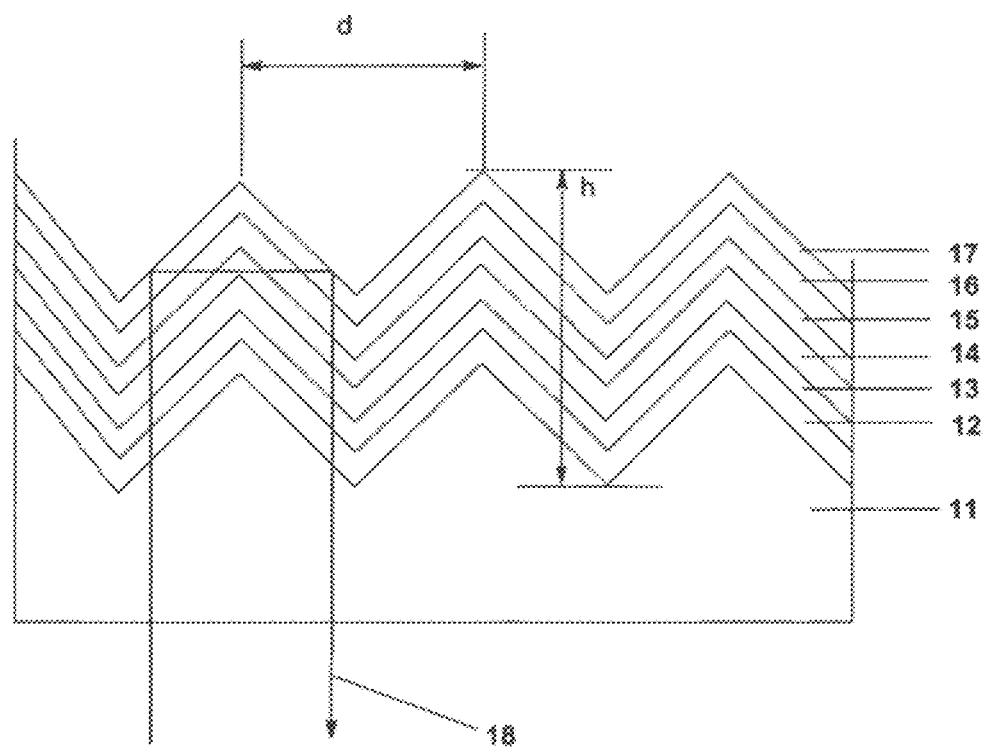
FIG. 11 is the schematic diagram of a structure of an illustrative photoactive component on microstructured substrate.

In a further working example of the invention, in FIG. 11 a light trap is used to extend the optical pathway of the incident light in the active system.

The light trap is implemented by virtue of the component being formed on a periodically microstructured substrate and the homogeneous function of the component, the short circuit-free contact connection thereof and a homogeneous distribution of the electrical field over the whole area being ensured by the use of a doped wide-gap layer. It is particularly advantageous that the light passes through the absorber layer at least twice, which can lead to increased light absorption and as a result to improved efficiency of the solar cell. This can be achieved, for example, as in FIG. 11, by virtue of the substrate having pyramid-like structures on the surface with heights (h) and widths (w) each in the range from one micrometer to several hundred micrometers. The height and width may be selected identically or differently. It is likewise possible for the pyramids to have symmetric or asymmetric structure. The width of the pyramid-like structures here is between 1 μm and 200 μm. The height of the pyramid-like structures may be between 1 μm and 1 mm.

Figure 12:
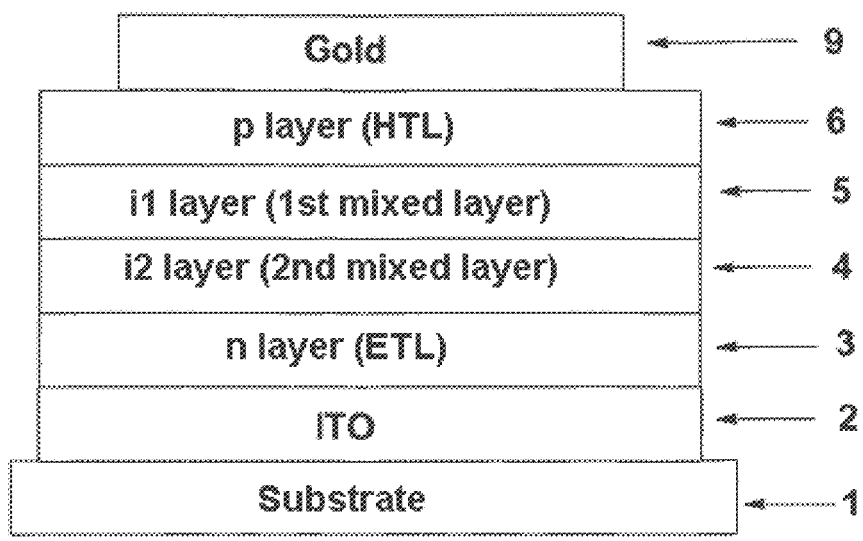
FIG. 12 is the schematic diagram of a structure of an illustrative photoactive component.

The reference numerals for FIG. 11 as provided along with exemplary dimensions as follows:

1 μm<d<200 μm
1 μm<h<1 mm
11: Substrate
12: Electrode; e.g. ITO or metal (10-200 nm)
13: HTL or ETL layer system (10-200 nm)
14: Mixed absorber layer 1 (10-200 nm)
15: Mixed absorber layer 2 (10-200 nm)
16: HTL or ETL layer system (10-200 nm)
17: Electrode, e.g. ITO or metal (10-200 nm)
18: Path of incident light In a further working example, the inventive photoactive component in FIG. 12 has the following layer sequence:

1.) Glass substrate 1,
2.) ITO base contact 2,
3.) Electron transport layer (ETL) 3,
4.) Mixed absorber layer 1 (10-200 nm) 4,
5.) Mixed absorber layer 2 (10-200 nm) 5,
6.) Hole transport layer (HTL) 6,
7.) Top contact (e.g. gold) 9

The invention claimed is:

1. A photoactive component comprising organic layers and comprising a single, tandem or multiple cell, the photoactive component comprising:
   first and second electrodes; and
   a photoactive acceptor-donor layer system between the electrodes, the photoactive acceptor-donor layer system comprising first, second and third absorber materials,
   wherein the first absorber material and the second absorber material are donors and the third absorber material is an acceptor or wherein the first absorber material and the second absorber material are acceptors and the third absorber material is a donor,
   wherein the second absorber material absorbs at greater wavelength than the first absorber material,
   wherein the second absorber material has a smaller Stokes shift and/or a smaller absorption width than the first absorber material, and
   wherein an absorption width of the second absorber material is 20 nm narrower than an absorption width of the first absorber material.

2. The photoactive component according to claim 1, wherein at least two absorber materials of the photoactive acceptor-donor layer system are present at least partly in a mixed layer.

3. The photoactive component according to claim 1, wherein an absorption range of at least one of the absorber materials extends into an infrared range in a wavelength range from 700 nm to 1500 nm.

4. The photoactive component according to claim 1, further comprising a first transport layer between the first electrode and the photoactive acceptor-donor layer system and a second transport layer between the second electrode and the photoactive acceptor-donor layer system.

5. The photoactive component according to claim 4, wherein the first transport layer is undoped or doped layer.

6. The photoactive component according to claim 5, wherein the second transport layer is undoped or doped layer.

7. The photoactive component according to claim 5, wherein the first transport layer is the undoped layer.

8. The photoactive component according to claim 5, wherein the first transport layer is the doped layer.

9. The photoactive component according to claim 4, wherein the first transport layer is a undoped or doped widegap layer with a maximum absorption at <450 nm.

10. The photoactive component according to claim 1, wherein the photoactive acceptor-donor layer system comprises a light trap that extends an optical path of incident light.

11. The photoactive component according to claim 1, wherein at least one of the absorber materials of the photoactive acceptor-donor layer system comprises a material selected from the group consisting of fullerenes or fullerene derivatives, phthalocyanines, perylene derivatives, TPD derivatives and oligothiophene derivatives.

12. The photoactive component according to claim 1, wherein HOMO levels of one of the first or second absorber materials differ by not more than 0.2 eV from the other absorber material.

13. The photoactive component according to claim 12, wherein HOMO levels of one of the first or second absorber materials differ by not more than 0.1 eV from the other absorber material.

14. The photoactive component according to claim 1, wherein the component comprises a combination of nip, ni, ip, pnip, pni, pip, nipn, nin, ipn, pnipn, pnin or pipn structures in which two or more independent combinations containing at least one i layer are stacked one on top of another.

15. The photoactive component according to claim 1, wherein the component is semitransparent at least within a certain light wavelength range.

16. The photoactive component according to claim 1, wherein the first absorber material and the second absorber material are the donors and the third absorber material is the acceptor.

17. The photoactive component according to claim 1, wherein the first absorber material and the second absorber material are the acceptors and the third absorber material is the donor.

18. The photoactive component according to claim 1, wherein the absorption width of the second absorber material is 50 nm narrower than an absorption width of the first absorber material.

19. A device comprising:
a carrier having a carrier surface; and
a photoactive component disposed on the carrier surface, wherein the photoactive component comprises first and second electrodes and a photoactive acceptor-donor layer system between the electrodes, the photoactive acceptor-donor layer system comprising first, second and third absorber materials,
wherein the first absorber material and the second absorber material are donors and the third absorber material is an acceptor or wherein the first absorber material and the second absorber material are acceptors and the third absorber material is a donor,
wherein the second absorber material absorbs at greater wavelength than the first absorber material,
wherein the second absorber material has a smaller Stokes shift and/or a smaller absorption width than the first absorber material; and
wherein an absorption width of the second absorber material is 20 nm narrower than an absorption width of the first absorber material.

20. The device according to claim 19, wherein the absorption width of the second absorber material is 50 nm narrower than an absorption width of the first absorber material.

* * * * *